(12) United States Patent
Kinsman

(10) Patent No.: US 7,541,658 B2
(45) Date of Patent: Jun. 2, 2009

(54) OPTICALLY INTERACTIVE DEVICE PACKAGE ARRAY

(75) Inventor: Larry D. Kinsman, Kuna, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 11/103,019

(22) Filed: Apr. 11, 2005

(65) Prior Publication Data

US 2005/0173811 A1    Aug. 11, 2005

Related U.S. Application Data

(62) Division of application No. 10/228,411, filed on Aug. 26, 2002.

(51) Int. Cl.
*H01L 31/0203* (2006.01)
(52) U.S. Cl. ........................ 257/433; 257/432
(58) Field of Classification Search .............. 257/433, 257/432
See application file for complete search history.

(56) References Cited

U.S. PATENT DOCUMENTS

| | | | |
|---|---|---|---|
| 4,601,526 A | 7/1986 | White et al. | |
| 4,878,043 A | 10/1989 | Heusquin et al. | |
| 5,270,491 A * | 12/1993 | Carnall et al. ............ | 174/50.54 |
| 5,458,716 A | 10/1995 | Alfaro et al. | |
| 5,709,960 A * | 1/1998 | Mays et al. ................. | 428/698 |
| 5,811,799 A * | 9/1998 | Wu ............................. | 250/239 |
| 5,923,958 A | 7/1999 | Chou | |
| 6,143,588 A | 11/2000 | Glenn | |
| 6,266,197 B1 | 7/2001 | Glenn et al. | |
| 6,285,064 B1 | 9/2001 | Foster | |
| 6,351,027 B1 | 2/2002 | Giboney et al. | |
| 6,545,332 B2 | 4/2003 | Huang | |
| 6,809,412 B1 | 10/2004 | Tourino et al. | |
| 2002/0037423 A1 * | 3/2002 | Yamamoto et al. .......... | 428/516 |
| 2003/0186047 A1 * | 10/2003 | Trouilhet ..................... | 428/343 |
| 2003/0222333 A1 | 12/2003 | Bolken et al. | |
| 2005/0029549 A1 | 2/2005 | Cobbley et al. | |
| 2006/0051892 A1 * | 3/2006 | Bolken et al. ................ | 438/106 |

OTHER PUBLICATIONS

Data Sheet, Amkor Technology, Inc., "VisionPak LLC," 2 pages.

* cited by examiner

*Primary Examiner*—Long Pham
(74) *Attorney, Agent, or Firm*—TraskBritt

(57) ABSTRACT

An image sensor package and methods for simultaneously fabricating a plurality of such packages. A layer of barrier material comprising a matrix of raised walls is formed around chip attachment areas located in an array on a carrier substrate to create chip cavities. Image sensor chips are wire bonded within the chip cavities, and a unitary transparent cover is sealed in place over the entire assembly. The resultant image sensor package array is then singulated along lines running between the chip attachment areas and in parallel to the raised walls to provide individual image sensor packages. The layer of barrier material may be formed directly on the carrier substrate by molding methods or by depositing a series of curable layers of liquid or flowable material in a stacked fashion. Alternatively, the layer of barrier material may be preformed as a unitary frame and then secured to the carrier substrate.

25 Claims, 10 Drawing Sheets

OPTICALLY INTERACTIVE DEVICE PACKAGE ARRAY

CROSS-REFERENCE TO RELATED APPLICATION

This application is a divisional of application Ser. No. 10/228,411, filed Aug. 26, 2002, pending.

BACKGROUND OF THE INVENTION

1. Field of the Invention

The present invention relates to packaging of optically interactive electronic devices. More particularly, the present invention relates to a package for a solid-state image sensor and methods for simultaneously assembling a plurality of such packages.

2. State of the Art

Solid-state image sensors, for example, charge coupled device (CCD) or complementary metal-oxide semiconductor (CMOS) chips, are increasingly in demand for incorporation into electronic devices. They may be used for a variety of applications including consumer electronics like digital cameras, cellular telephones and hand-held scanners. Conventionally, these image sensor chips have been packaged within a discrete housing for protection from environmental stresses and to provide electrical communication with other components of the larger electronic device into which they are incorporated. The typical housing is a unitary ceramic or plastic shell having a cavity into which an image sensor chip is mounted. The chip is wire bonded to conductive elements within the cavity, and a window or at least partially optically transparent lid covers the cavity to allow light or other forms of electromagnetic radiation to pass through to sensing circuitry on the active surface of the chip. The transparent lid may also be formed to provide an optical function such as focusing the light or other radiation and/or filtering selected wavelengths thereof. The materials and structure involved with this packaging technique require a fabrication process that can be time consuming, costly and consist of several precision assembly steps. Due to the competitive nature of today's semiconductor industry, even a small reduction in packaging cost would be of great benefit, especially when considered in terms of the high volume of components being manufactured to meet growing demands.

In response to large-scale production requirements, various attempts have been made to simplify the construction of image sensor packaging. U.S. Pat. No. 6,351,027 to Giboney et al. and U.S. Pat. No. 6,285,064 to Foster, for instance, disclose wafer-level packaging formed by laying a solid sidewall piece or an adhesive matrix over a wafer having an array of sensor devices and covering it with a transparent top piece. The wafer is then singulated to create discrete chip-scale packages. While this approach reduces material costs and assembly steps, it does not completely protect the semiconductor chips from the environment and requires attaching material directly to the wafer surface, which could damage the sensor devices. U.S. Pat. No. 6,266,197 to Glenn et al. discloses a method for forming image sensor packages wherein an array of image sensors is wire bonded to a carrier substrate, and a molded window array is placed over the array of image sensors. The substrate and attached molded window array are then singulated to form a plurality of individual image sensor packages. The molded window array of Glenn et al., however, still suffers from the fact that individual transparent windows must be formed within or later attached to the molded array, requiring additional assembly and alignment steps during fabrication. U.S. Pat. No. 5,811,799 to Wu discloses an image sensor package formed by attaching a plurality of preformed or glue walls to an array of printed wiring frames having image sensors thereon and sealing the walls with transparent material. The printed wiring frames are then diced to form discrete packages. Once again, this arrangement may require the attachment or formation of multiple components during fabrication, and the disclosed printed wiring frames have a conductive via output arrangement that may not be suitable for certain high I/O image sensor chips.

As is evident from the foregoing description of the state of the art, what is needed is a simplified method for forming an image sensor package that is conducive to mass production while still offering suitable and robust protection for an image sensor chip.

BRIEF SUMMARY OF THE INVENTION

In accordance with the present invention, a plurality of packages for image sensors and other optically interactive electronic devices are simultaneously fabricated to minimize assembly steps and reduce the cost associated with each individual package. A carrier substrate is provided with an array of image sensor chip or other optically interactive electronic device attachment areas. A layer of barrier material having apertures coinciding with the chip or device attachment areas is formed on, or secured to, the substrate surface to create an array of cavities, each sized and configured for containing an image sensor chip or other optically interactive electronic device. An image sensor chip or other optically interactive electronic device is mounted within each cavity and wire bonded to conductive traces on the carrier substrate. A unitary, at least partially optically transparent cover is then sealed in place over the unitary layer of barrier material. Next, the assembly is cut or otherwise divided along lines running between adjacent cavities to form a plurality of individual packages. If required, the packages may then proceed through additional fabrication steps such as solder ball attachment or castellated pad formation, or these steps may be completed prior to dividing the assembly into individual packages.

While described primarily in terms of an image sensor package, it is to be understood that the present invention may be used for packaging various other optically interactive electronic devices which require a window for access to a device surface. The term "optically interactive" as used herein is meant to encompass devices sensitive to various wavelengths of light or other forms of radiation, including, but not limited to, CCD and CMOS image sensors, EPROM's, and photodiodes, as well as light-emitting devices including semiconductor lasers and light-emitting diodes.

Other and further features and advantages will be apparent from the following detailed description of the present invention when read in conjunction with the accompanying drawings. It should be understood that the described embodiments are provided for illustrative and exemplary purposes only, and that variations to, and combinations of, the several elements and features thereof are contemplated as being within the scope of the invention.

BRIEF DESCRIPTION OF THE SEVERAL VIEWS OF THE DRAWINGS

In the drawings, which illustrate what is currently considered to be the best mode for carrying out the invention.

DETAILED DESCRIPTION OF THE INVENTION

Figure 1:
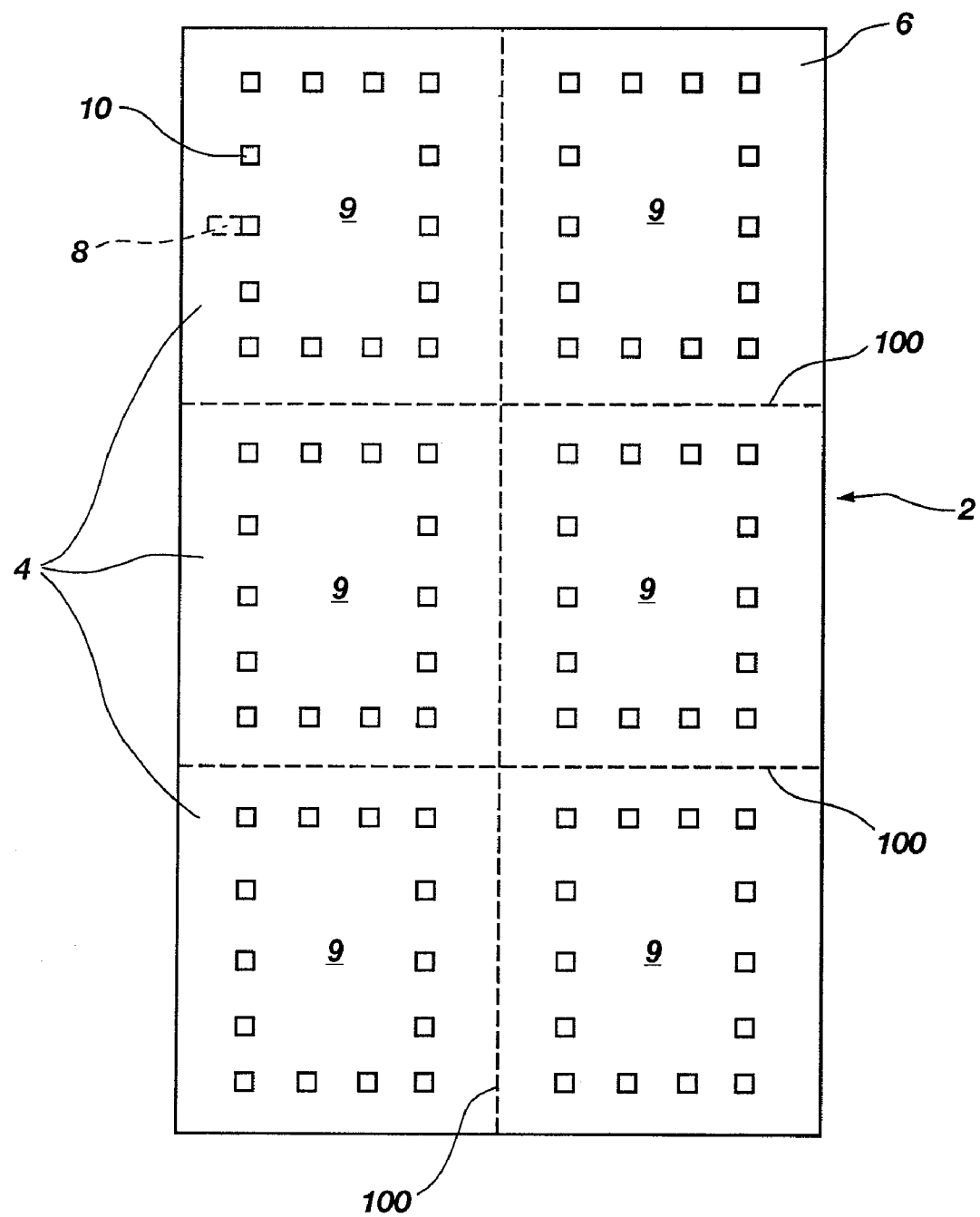
FIG. 1 is a top view of a carrier substrate according to the present invention having an array of image sensor chip attachment areas.

Referring in general to the accompanying drawings, various aspects of the present invention are illustrated to show exemplary image sensor package structures and methods for assembly of a package for housing an image sensor chip. Common elements of the illustrated embodiments are designated with like reference numerals. It should be understood that the figures presented are not meant to be illustrative of actual views of any particular portion of a particular image sensor package structure, but are merely idealized schematic representations which are employed to more clearly and fully depict the invention. It should further be understood that while depicted in terms of an image sensor, the package embodiments and methods presented herein would work equally well for housing other types of optically interactive electronic devices as described above.

Turning to FIGS. 1 through 13, methods for simultaneously assembling a plurality of image sensor packages according to the present invention are illustrated. A carrier substrate 2, shown in FIG. 1, is provided with an array of image sensor chip attachment areas 4 formed on its top surface 6. Broken section lines 100 are shown running in mutually perpendicular horizontal and vertical directions on top surface 6 to indicate the boundary between adjacent image sensor chip attachment areas 4. Carrier substrate 2 may be a printed circuit board (PCB) having conductive traces 8 (see FIGS. 12 and 13) thereon, and may be formed using conventional PCB fabrication techniques. Carrier substrate 2 may be constructed with common PCB materials such as a BT resin or FR4 or FR5 laminate in order to reduce cost, but other materials such as silicon, ceramics or plastics may be used as well. Each image sensor chip attachment area 4 includes a chip adherence surface 9 bounded by a plurality of wire bonding locations 10 for wire bonding to conductive traces 8, one of which is shown in broken lines in FIG. 1, conductive traces 8 extending to locations for electrical connection of the completed image sensor package to higher-level packaging, such as a circuit board, for operation. The length, orientation, and configuration of conductive traces 8 may be as desired, depending on the I/O format used to connect the completed image sensor package, and so will not be discussed further at this juncture.

Figure 2:
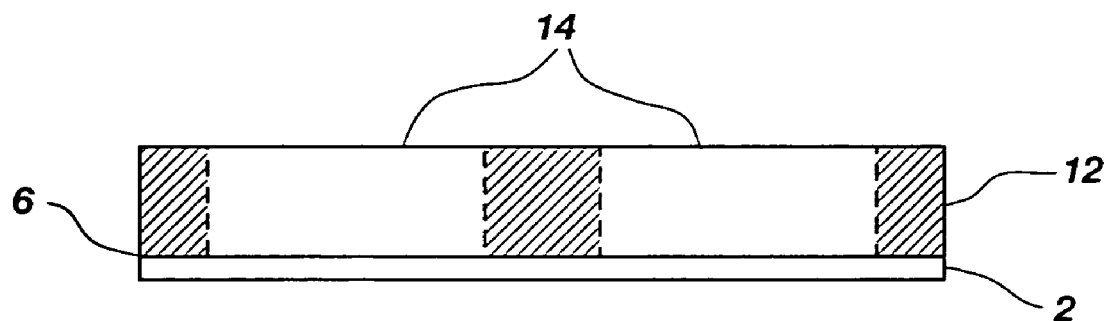
FIG. 2 is a side view of the carrier substrate of FIG. 1 having a layer of barrier material formed on its top surface.
Figure 3A:
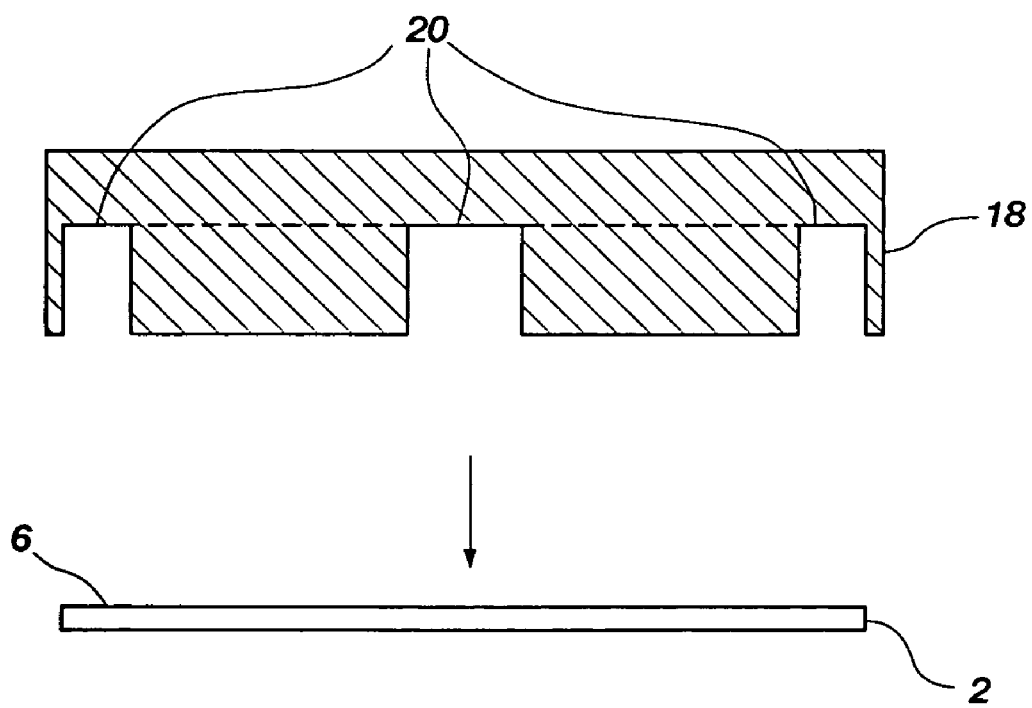
FIGS. 3A through 3C are schematic sectional side views showing a first method for forming the layer of barrier material depicted in FIG. 2 by molding it onto the carrier substrate.
Figure 3B:
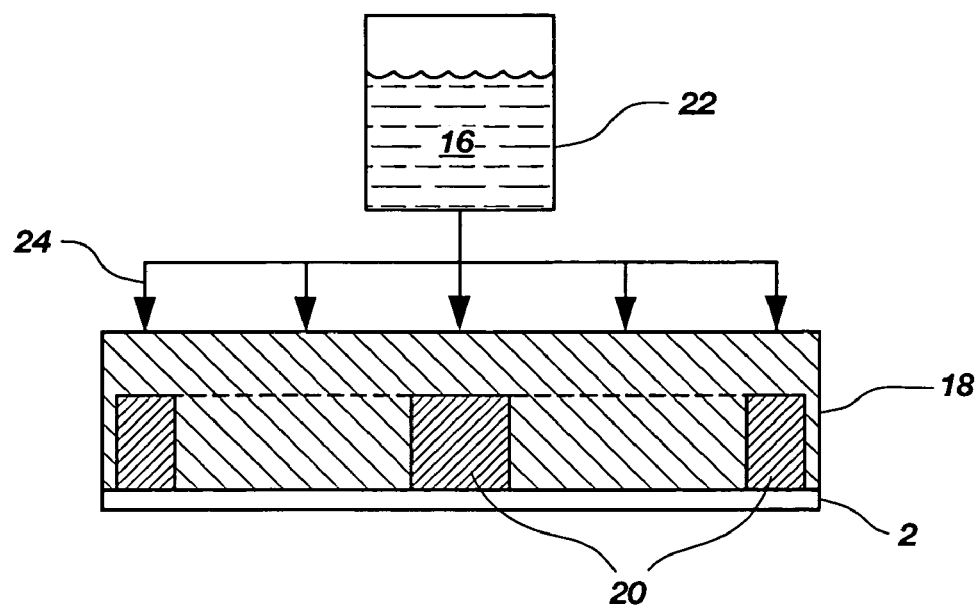
Figure 3C:
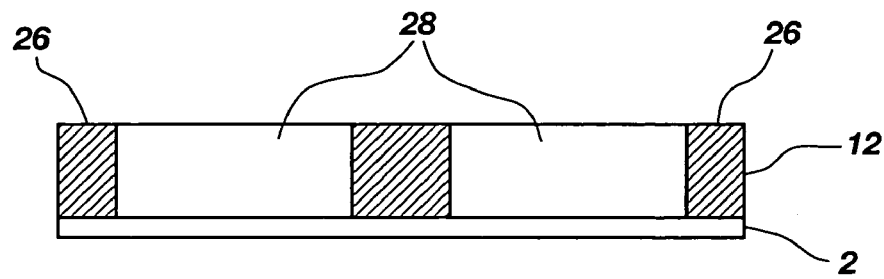
Figure 3D:
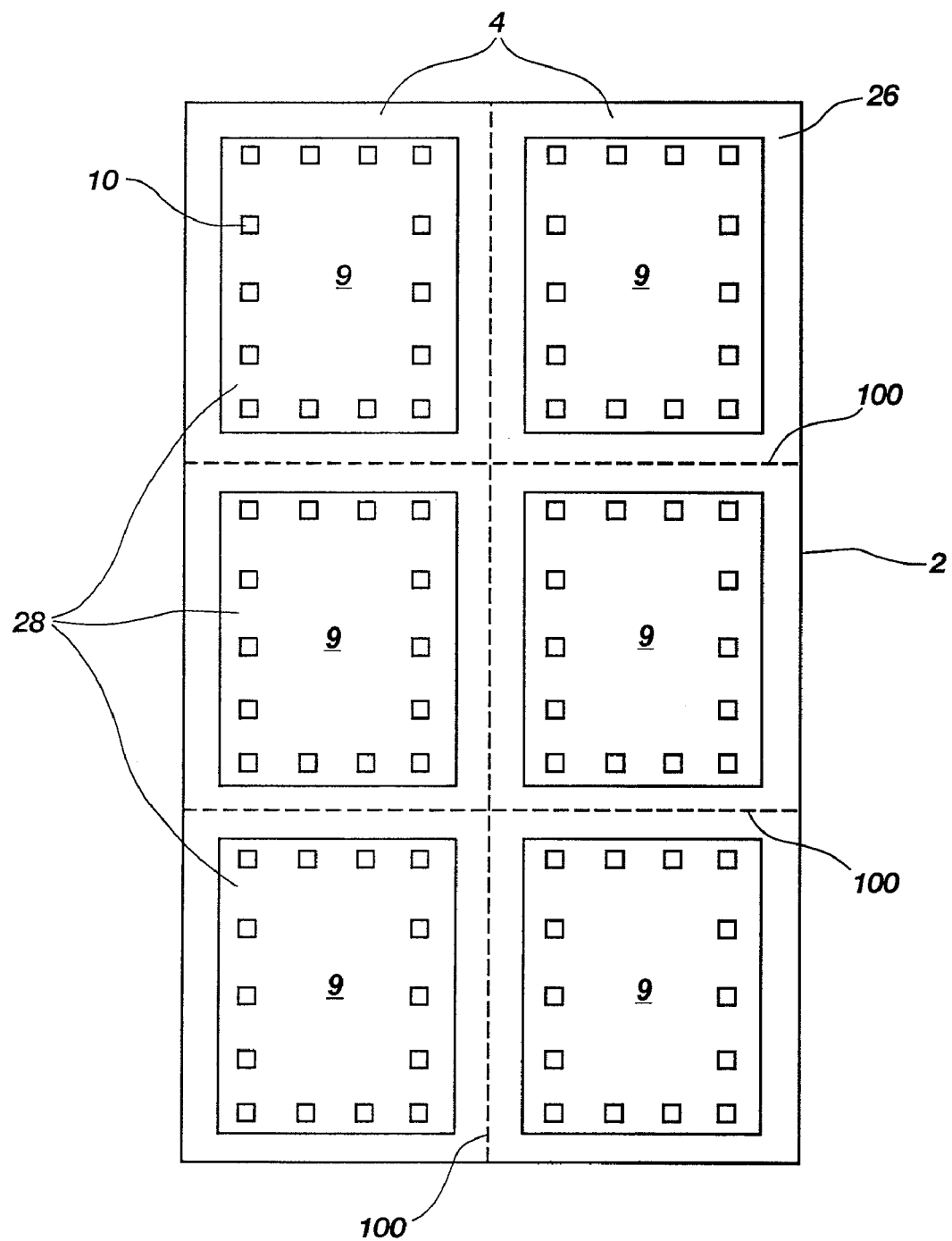
FIG. 3D is a top view of the carrier substrate depicted in FIG. 1 after the addition of the layer of barrier material.

A layer of barrier material 12 having apertures 14 therein coinciding with image sensor chip attachment areas 4 is then formed on, or secured to, the carrier substrate top surface 6, as illustrated in FIG. 2. In a currently preferred embodiment of the present invention, layer of barrier material 12 is formed from a mold compound 16 which is molded directly onto top surface 6. This method is depicted in FIGS. 3A through 3C. As shown in FIG. 3A, a transfer molding tool or platen 18 including contiguous mold cavities 20 is placed in sealing relationship against top surface 6 of carrier substrate 2 with mold cavities 20 positioned over the perimeter of carrier substrate 2 and over areas coinciding with, and preferably bisected by, broken section lines 100 (see FIG. 1) defining boundaries between adjacent image sensor chip attachment areas 4. FIG. 3B shows that a liquified or otherwise molten mold compound 16, such as a thermoplastic, silicon-filled polymer, is rapidly transferred under pressure from a reservoir 22 into mold cavities 20 via a plurality of runners 24, the general process of transfer molding being well known in the art. The mold compound 16 then cures and hardens as it cools, and molding tool or platen 18 is removed from the top surface 6 of carrier substrate 2, leaving the structure as seen in FIG. 3C. The cured mold compound 16 comprises a contiguous matrix of raised walls 26 that surround each image sensor chip attachment area 4 (see FIG. 1) to define apertures 14, leaving the portion of image sensor chip attachment areas 4 containing chip adherence surface 9 and wire bonding locations 10 exposed, creating an array of chip cavities 28 sized and configured for receiving image sensor chips 52, which are described in further detail below. FIG. 3D is a top view of carrier substrate 2 showing the arrangement of raised walls 26 surrounding chip attachment areas 4.

As noted above, mold compound 16 may be a thermoplastic polymer or other suitable encapsulant material as known in the art. Further, a filler material such as fine silicon particles may be incorporated within the mold compound to reduce cost, also as known in the art. It should also be understood that while the present invention is described in terms of transfer molding, other molding techniques such as injection molding or pot molding could be used with an appropriately formulated mold compound. Other suitable materials for mold compounds as known in the art include, without limitation, thermoset polymers and epoxy compounds.

Figure 4A:
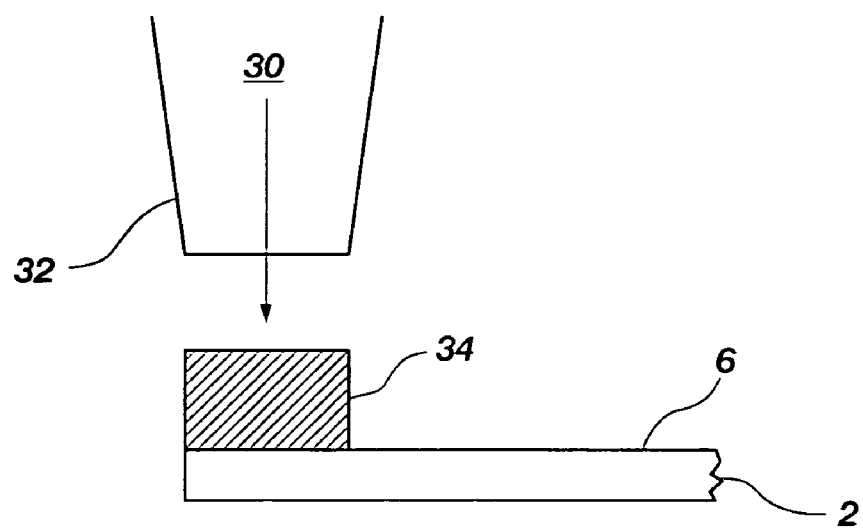
FIGS. 4A and 4B are partial sectional side views showing a second method for forming the layer of barrier material depicted in FIG. 2 by depositing layers of a cure-hardened liquid onto the carrier substrate.
Figure 4B:
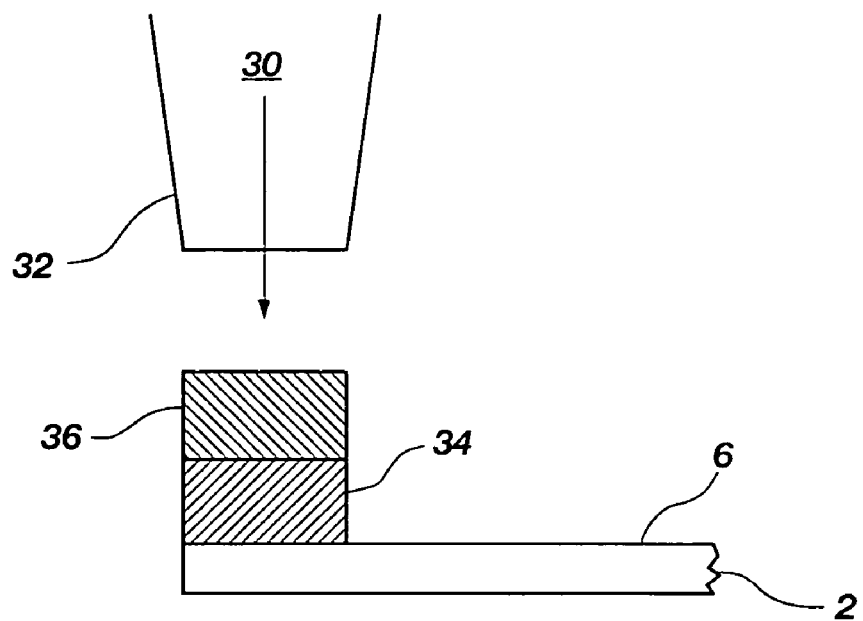

Another approach to forming a layer of barrier material 12 onto top surface 6 includes disposing a flowable material on top surface 6 in one or more sequentially cured layers to build the contiguous matrix of raised walls 26. In one exemplary embodiment of this method shown in FIG. 4A, a high-viscosity liquid or gel 30 is dispensed from a nozzle 32 around the perimeter of carrier substrate 2 and along broken section lines 100 (not shown). The high-viscosity liquid or gel 30 is then cured to form a first hardened layer 34. In FIG. 4B, an additional layer of high-viscosity liquid or gel 30 is dispensed over first hardened layer 34 and cured to form second hardened layer 36. Subsequent layers of liquid or gel 30 may be added, as desired, until the desired height for layer of barrier material 12 (see FIG. 3C) is reached. Liquid or gel 30 may comprise an activated epoxy or any other curable resin-type material that may be hardened by reaction of constituents thereof, application of heat thereto, or otherwise as known in the art.

Figure 5A:
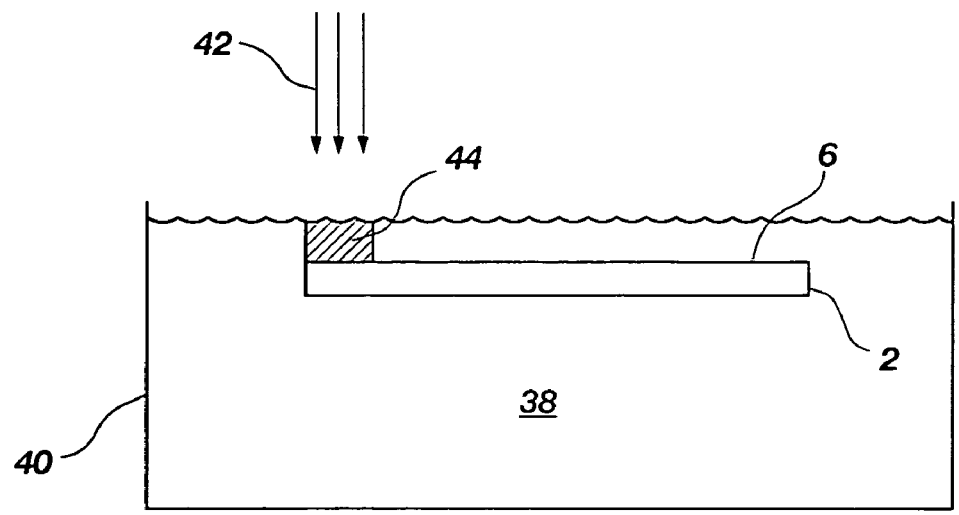
FIGS. 5A and 5B are sectional side views showing a third method for forming the layer of barrier material depicted in FIG. 2 by using stereolithography.
Figure 5B:
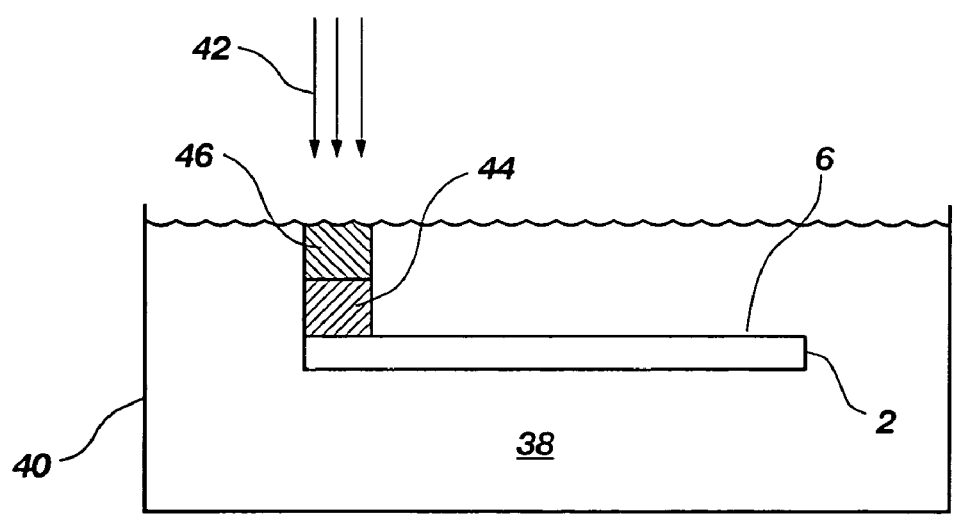

Another exemplary embodiment of this layering approach exists in using a stereolithographic (STL) deposition process to form the contiguous matrix of raised walls 26 on top surface 6. As defined in the art, STL involves the formation of solid structures by selectively curing portions of volumes of a liquid polymer or resin material contained within a tank or reservoir. Depending on the liquid material composition, curing may he accomplished by exposure to irradiation with selected wavelengths of light or other electromagnetic radiation, for instance, when curing a material susceptible to initiation of cross-linking by exposure to ultraviolet (UV) radiation, such as through use of a UV laser beam. By curing one or more successive layers of the liquid material, intricate solid structures of almost any shape may be formed. It is also possible to add elements to an existing structure using STL, as would be the case with the present invention. FIGS. 5A and 5B illustrate this technique. In FIG. 5A, carrier substrate 2 is placed to a selected depth below the surface of a photocurable liquid 38 contained within a reservoir 40. The use of a photocurable liquid 38 is only exemplary, and liquid materials cured by other activating agents could also be used. A focused beam of light such as a laser beam 42 is directed over the surface of photocurable liquid 38 in a pattern that coincides with the perimeter of carrier substrate 2 and broken section lines 100 (see FIG. 1) between image sensor chip attachment areas 4. The portions of the photocurable liquid 38 exposed to laser beam 42 cures to at least a semisolid state, forming a first layer of cured material 44 on top surface 6. FIG. 5B shows that carrier substrate 2 may then be lowered another selected depth within reservoir 40, and the laser beam 42 directed over the same pattern to form a second layer of cured material 46 on top of the first layer 44. As with the previous dispensing embodiment, subsequent layers may be added until the desired height for layer of barrier material 12 is reached. Complete and accelerated curing of the photocurable material may be effected by devoted temperatures after cross-linking is initiated. Suitable equipment for forming a barrier layer as described is commercially available from 3D Systems, Inc. of Valencia, Calif. Suitable photocurable liquids which may be used with the 3D Systems, Inc. equipment is available from Ciba Specialty Chemicals Inc.

Figure 6:
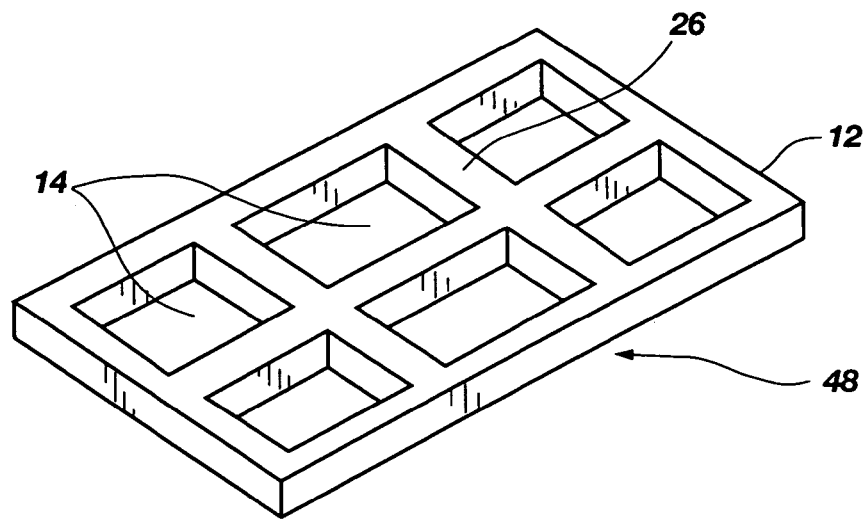
FIGS. 6 and 7 are perspective views showing a fourth method for forming the layer of barrier material depicted in FIG. 2 by attaching a preformed unitary frame to the carrier substrate.
Figure 7:
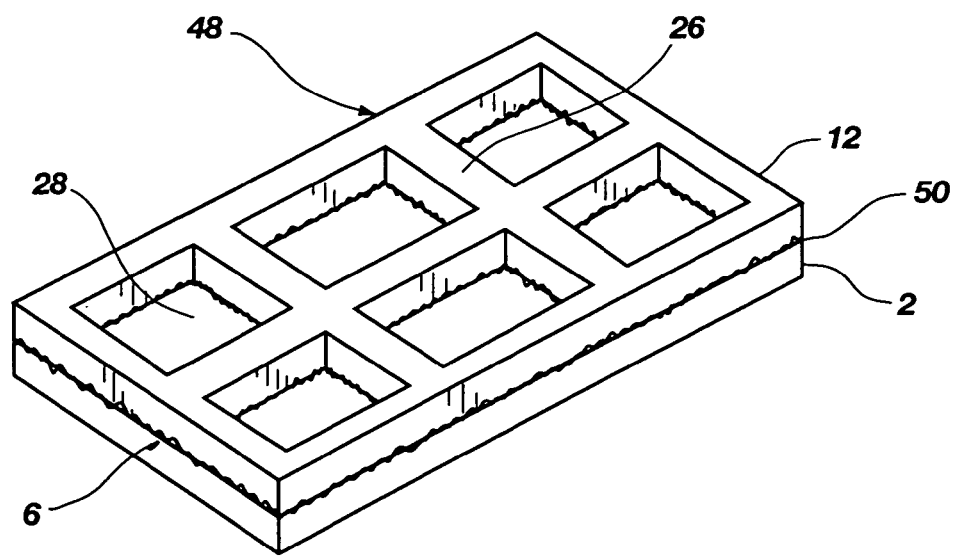

In certain situations, it may be desirable to preform the layer of barrier material 12 defined by raised walls 26 and then secure it to carrier substrate 2. FIG. 6 shows an exemplary preformed unitary frame 48 used for this purpose. Preformed unitary frame 48 may be preformed by one of the previously described molding techniques, or may be formed from a sheet of solid material such as a plastic, silicon, or green ceramic by removal of selected portions thereof. In the case of molding, the array of apertures 14 may be directly molded into preformed unitary frame 48. When formed from a solid material, apertures 14 may be cut, stamped, milled, or etched into a sheet of material, the process employed being dictated by the material selected. Once completed, preformed unitary frame 48 may be secured to top surface 6 of carrier substrate 2 with an adhesive material 50, as illustrated in FIG. 7. Adhesive material 50 may be in the form of an epoxy, a silicone, an acrylic or other liquid-type adhesive applied to top surface 6 and/or preformed unitary frame 48, or may comprise a double-sided adhesive-coated tape segment or film, such as a polyimide. Alternatively, a two-component resin may be employed, with one component applied in an appropriate pattern to top surface 6 of carrier substrate 2 and the other to a surface of preformed unitary frame 48 to be placed in contact with top surface 6 to prevent premature component reaction and adhesion.

Figure 8:
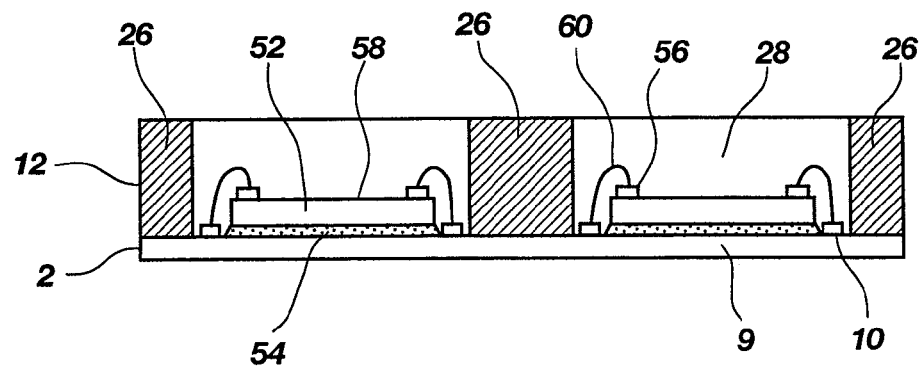
FIG. 8 is a sectional side view showing image sensor chips mounted and wire bonded within chip cavities formed by the carrier substrate and the layer of barrier material.

After formation or attachment of the layer of barrier material 12 on top surface 6, an image sensor chip 52 is mounted within each of the chip cavities 28 on chip adherence surface 9. Image sensor chips 52 are secured to chip adherence surface 9 with a layer of adhesive material 54, as shown in FIG. 8. As with adhesive material 50, the layer of adhesive material 54 may be an epoxy, a silicone, an acrylic or other liquid-type adhesive, a two-component resin, or a double-sided adhesive-coated tape segment or film. If required or desired, adhesive material 54 may comprise a conductive adhesive or bonding agent to ground or electrically bias the back side of image sensor chips 52, in which instance a conductive or conductor-filled epoxy, a silver solder or a Z-axis anisotropic conductive adhesive may be employed. If a preformed unitary frame 48 is used for layer of barrier material 12 and raised walls 26, adhesive material 50 and the layer of adhesive material 54 may be applied to top surface 6 of carrier substrate 2 at the same time, in a single step, before preformed unitary frame 48 is aligned with carrier substrate 2 and placed on top surface 6. Once image sensor chips 52 are in place, bond pads 56 on the active surface 58 of each image sensor chip 52 are connected to wire bonding locations 10 on top surface 6 with gold or aluminum wire bonds 60, as known in the art. It is contemplated that, if a preformed unitary frame 48 is used for layer of barrier material 12, image sensor chips 52 may be placed, wire bonds 60 formed, and then preformed unitary frame 48 carrying adhesive on the surface thereof facing top surface 6 of carrier substrate 2 aligned and adhered to top surface 6 to provide enhanced clearance for a wire bonding capillary.

Figure 9:
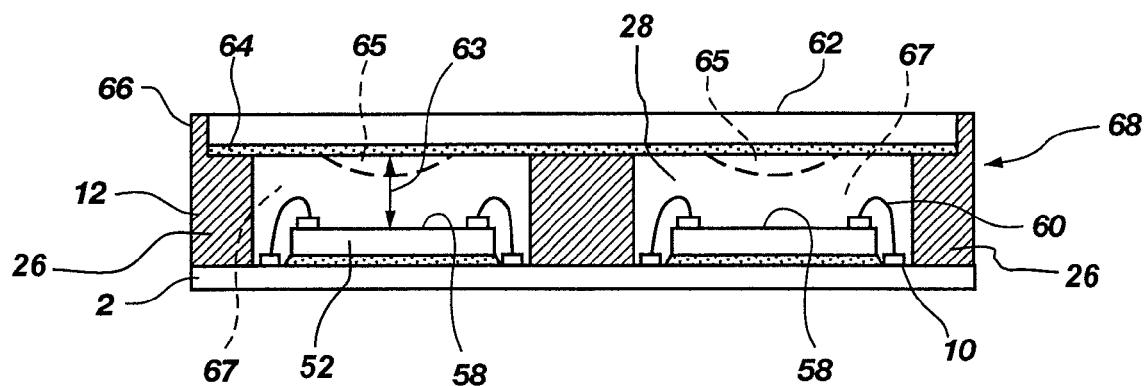
FIG. 9 is a sectional side view showing a unitary transparent cover sealed to the assembly depicted in FIG. 8.

The resulting assembly is now ready to receive a unitary transparent cover 62. Unitary transparent cover 62 is configured to substantially conform to the configuration of carrier substrate 2, so that it covers the entire array of chip cavities 28 and extends over the peripherally outer portions of the contiguous matrix of raised walls 26. Stated another way, unitary transparent cover 62 is dimensioned substantially the same as carrier substrate 2, such term including both slightly smaller and slightly larger dimensions. In FIG. 9, unitary transparent cover 62 is aligned with carrier substrate 2, placed on the top of the layer of barrier material 12 and continuously sealed in place along the tops of the matrix of raised walls 26. Unitary transparent cover 62 may be formed of an at least partially optically transparent material such as borosilicate glass (BSG). Of course, other types of glass, quartz, or even plastic, which allow the passage of a desired range of wavelengths of light or other forms of electromagnetic radiation, may also be used. Furthermore, unitary transparent cover 62 may be formed to provide an optical function, for example, shaping its surface at locations corresponding to chip cavities 28 to act as focusing microlenses, as shown in broken lines 65.

To secure unitary transparent cover 62 in place along the tops of raised walls 26 and hermetically seal the image sensor chips 52 within each respective chip cavity 28, a bead of epoxy, silicone gel or other liquid or gel adhesive 64 may be applied to the tops of raised walls 26 of the layer of barrier material 12, directly to unitary transparent cover 62 along selected lines, or both, prior to attachment. If desired, a two-component adhesive resin may be employed, with one component applied to the tops of raised walls 26 and the other to unitary transparent cover 62 so that a cure will not commence until the two components are in contact. Other sealing mechanisms, such as the previously described double-sided adhesive-coated tape, may be used as well, as long as they provide a suitable hermetic bond. It is desirable, so that the optical capabilities of image sensor chips 52 are not compromised, that any adhesive used be of a type which does not outgas volatiles or other compounds when curing, so as not to compromise the properties of the image sensor chips 52. A snap-cure epoxy, as known in the art, may be suitable, as may an epoxy cured to a B-stage, or tacky state, prior to application of unitary transparent cover 62. In some instances, the layer of barrier material 12 may be of a composition such that a thermal- or pressure-initiated bonding process may be used to adhere unitary transparent cover 62 directly to layer of barrier material 12 without the aid of an additional adhesive. As seen in FIG. 9, a vertical gap 63 exists between active surfaces 58 of image sensor chips 52 and unitary transparent cover 62. For high-end image sensor chips 52, it is often a requirement that active surface 58 be free of contact from any covering material to prevent interference with sensing circuitry and unwanted refraction of light. Accordingly, when one of these high-end image sensor chips 52 is packaged using the present invention, gap 63 will be left free of any filler material. Gap 63 also maintains unitary transparent cover 62 above the tops of wire bonds 60. If an image sensor chip 52 not having the requirement of a material-free gap is used, a transparent encapsulant material 67 may be used to fill chip cavities 28. Such transparent encapsulant material 67, which is indicated by a broken lead line extending into chip cavity 28 in FIG. 9, may also be used to provide a transitional index of refraction between the image sensor chip 52 and the index of refraction of the unitary transparent cover 62, if desired. This approach would also secure and protect wire bonds 60, and the transparent encapsulant material 67 may also be used as the adhesive mechanism for securing unitary transparent cover 62. Example materials for transparent encapsulant material 67 may include clear epoxy, silicone, acrylic or other suitably transparent resin type materials.

In order to promote proper alignment of unitary transparent cover 62, a raised lip 66 may be formed around the perimeter of the layer of barrier material 12, as shown in FIG. 9. Raised lip 66 may be formed integrally with, and at the same time as, forming the layer of barrier material 12 by any previously described technique. Unitary transparent cover 62 may then be aligned with the layer of barrier material 12 by placement within raised lip 66.

Figure 10:
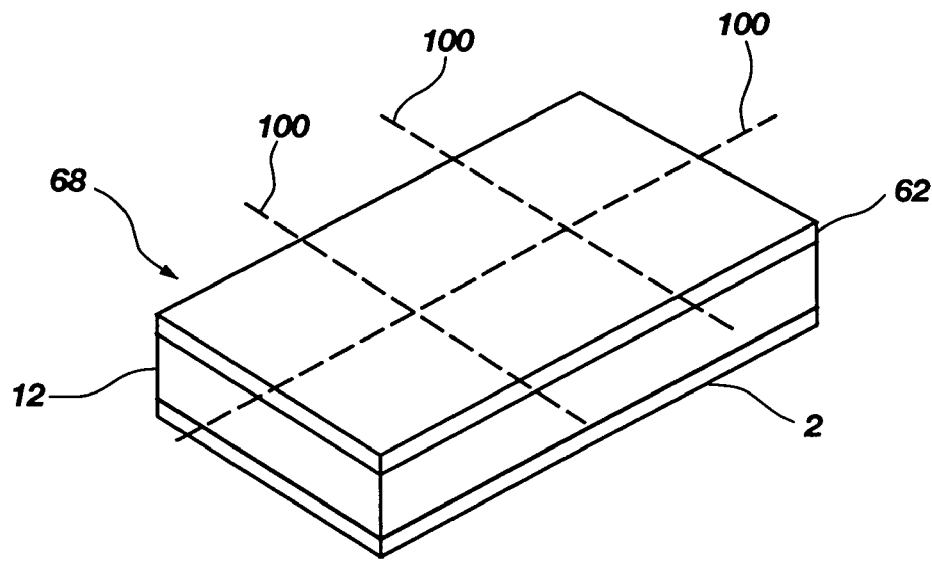
FIG. 10 is a perspective view of an image sensor array prior to singulation.
Figure 11:
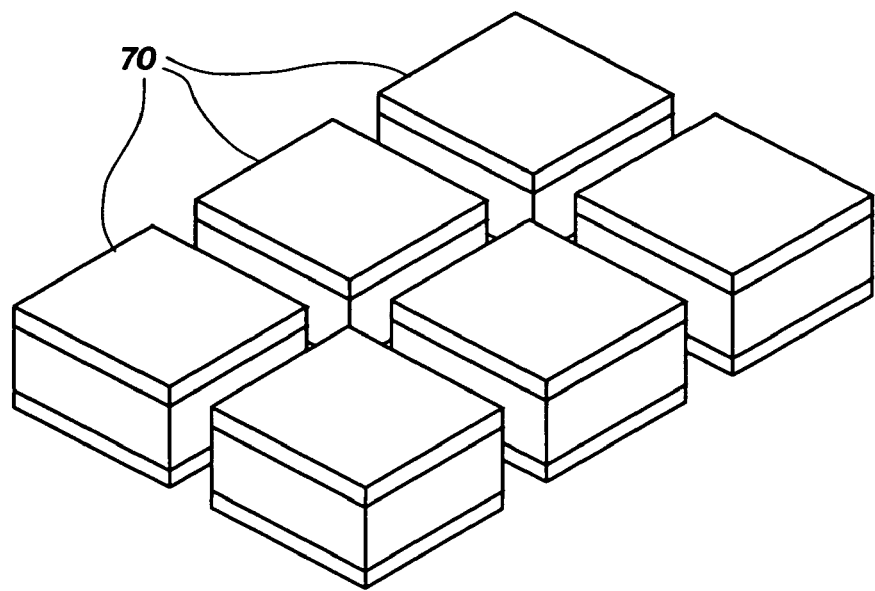
FIG. 11 is a perspective view of individual image sensor packages which have been separated from the image sensor array depicted in FIG. 10.
Figure 12:
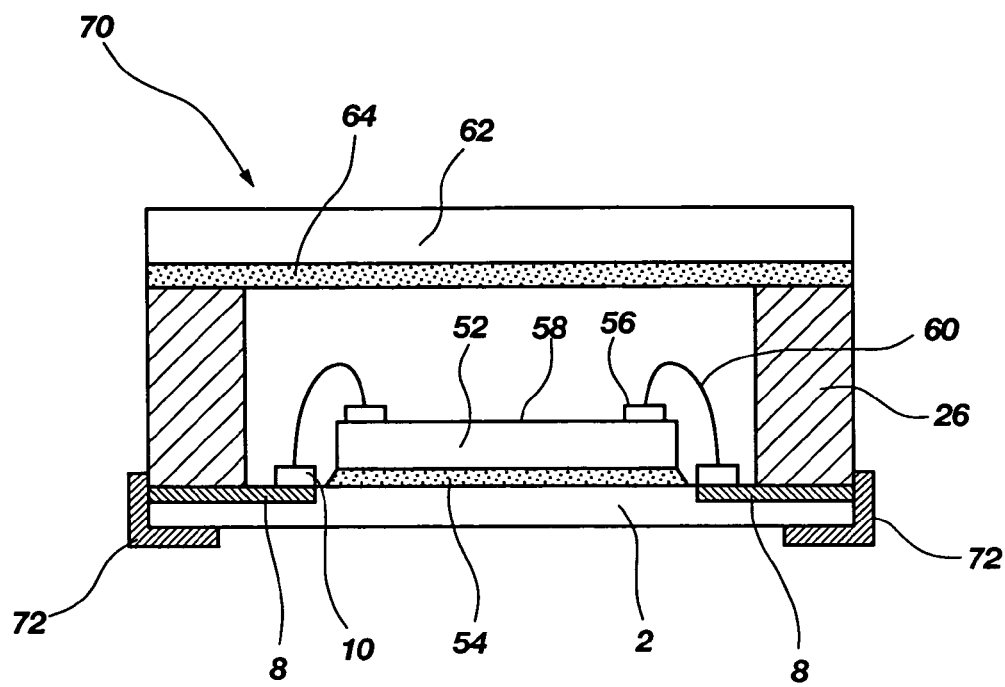
FIG. 12 is a sectional side view of an image sensor package depicted in FIG. 11, wherein castellated solder pads have been added to form a leadless chip carrier.

Once unitary transparent cover 62 is sealed in place, the assembly essentially comprises an image sensor package array 68. Image sensor package array 68 may now be cut or otherwise singulated to separate out individual image sensor packages. FIGS. 10 and 11 illustrate this process. FIG. 10 is a perspective view of image sensor package array 68, having the location of broken section lines 100 indicated above the top surface thereof. Carrier substrate 2, the layer of barrier material 12 and unitary transparent cover 62 are simultaneously cut along broken section lines 100 which run along the centers of raised walls 26 and divide image sensor package array 68 into individual image sensor packages 70 as shown in FIG. 11. This may be accomplished, for example, by cutting or scribing (followed by snapping image sensor packages 70 apart along the scribe lines) with a conventional wafer saw. Alternatively, the individual image sensor packages 70 may be singulated using a laser or other high energy beam.

Figure 13:
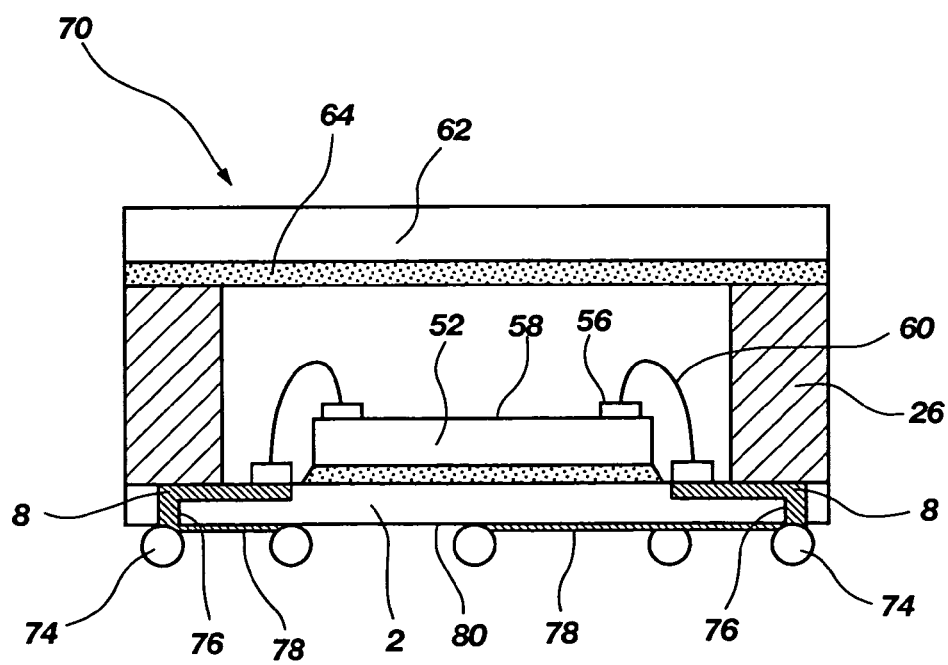
FIG. 13 is a side sectional view of an image sensor package depicted in FIG. 11, wherein an array of discrete conductive elements has been added to form a ball grid array package.

For attachment of an image sensor package 70 to a higher-level packaging component such as an assembly substrate for communication with other components of an electronic device, metallized pads or other contact interfaces for electrical communication of image sensor chip 52 through conductive traces 8 are required. In one exemplary embodiment of the present invention shown in FIG. 12, a plurality of castellated solder pads 72 in respective communication with different traces 8 may be formed by techniques known in the art around the perimeter of a singulated image sensor package 70 to form a leadless chip-carrier (LCC) image sensor package. In another exemplary embodiment shown in FIG. 13, discrete conductive elements 74 such as tin/lead solder balls, gold bumps or conductive or conductor-filled epoxy bumps, columns or pillars may be formed on or attached to the lower ends of vias 76 extending from conductive traces 8 in an array pattern on the bottom of singulated image sensor package 70 to form a ball-grid array (BGA)-type image sensor package, as illustrated by FIG. 13. A redistribution layer (RDL) of conductive traces 78 may also be applied to or formed on the bottom surface 80 of carrier substrate 2 in communication with the lower ends of selected vias 76 to configure a suitable pad array for formation or disposition of discrete conductive elements 74 thereon. It is also contemplated, and currently preferred with a BGA-type arrangement, that discrete conductive elements 74 be attached to image sensor package array 68 prior to its singulation into individual image sensor packages 70. This would be advantageous as discrete conductive elements 74 may thus be formed on or applied to all of the image sensor packages 70 of a given image sensor package array in a single step.

All of the above-illustrated embodiments and variations thereof of the present invention provide image sensor packages that are simultaneously fabricated to minimize assembly steps and reduce the cost associated with each individual package. Although the present invention has been depicted and described with respect to the illustrated embodiments, various additions, deletions and modifications are contemplated within its scope. For instance, if so desired, it is also contemplated that the layer of barrier material 12 may initially be formed on, or secured to, unitary transparent cover 62 rather than carrier substrate 2. Barrier material would be similarly formed on unitary transparent cover 62 using one of the above described molding, deposited layering, or preform attach methods described above. The combination of unitary transparent cover 62 and barrier material 12 would then be secured to the top surface 6 of carrier substrate 2 after attachment and electrical connection of image sensor chips 52 to image sensor chip attachment areas 4. In the same manner, securing and hermetic sealing of barrier material 12 to carrier substrate 2 may be accomplished with a bead of epoxy, silicone or other liquid or gel adhesive, double-sided adhesive-coated tape or thermal or pressure initiated bonding.

Furthermore, as previously discussed, the present invention would be suitable for packaging various other types of optically interactive electronic devices. The scope of the invention is, therefore, indicated by the appended claims rather than the foregoing description. Further, all changes which may fall within the meaning and range of equivalency of the claims and elements and features thereof are to be embraced within their scope.

What is claimed is:

1. An optically interactive electronic device package array, comprising:

a carrier substrate having an array of device attachment areas on a surface thereof, each of the device attachment areas comprising a chip attachment surface and at least one associated wire bonding location in communication with at least one conductive trace on the carrier substrate;

a layer of barrier material comprising a contiguous matrix of raised walls defining an array of apertures therethrough secured to the surface of the carrier substrate, each of the apertures exposing the chip attachment surface and the at least one associated wire bonding location of one of the device attachment areas to form an array of chip cavities;

a plurality of optically interactive electronic devices within the array of apertures defined by the contiguous matrix of raised walls, each having at least one bond pad on an active surface thereof attached to the chip attachment surface in a corresponding chip cavity of the array of chip cavities;

a wire bond connecting the at least one bond pad on the active surface of an optically interactive electronic device of the plurality and the at least one associated wire bonding location in the corresponding chip cavity of the array of chip cavities; and a unitary transparent cover having dimensions substantially equal to those of the carrier substrate sealed to a top surface of the layer of barrier material and covering the plurality of optically interactive electronic devices within the array of apertures defined by the contiguous matrix of raised walls.

2. The optically interactive electronic device package array of claim 1, wherein the layer of barrier material comprises a contiguous matrix of raised walls attached directly to the surface of the carrier substrate.

3. The optically interactive electronic device package array of claim 2, wherein the contiguous matrix of raised walls comprises a polymer mold compound.

4. The optically interactive electronic device package array of claim 3, further comprising:
a filler material incorporated within the polymer mold compound.

5. The optically interactive electronic device package array of claim 4, wherein the filler material comprises silicon particles.

6. The optically interactive electronic device package array of claim 1, wherein the layer of barrier material comprises a contiguous matrix of raised walls formed of a plurality of stacked layers of cured material.

7. The optically interactive electronic device package array of claim 6, wherein the plurality of stacked layers is formed of one of the group consisting of a mold compound, an activated epoxy and a resin material.

8. The optically interactive electronic device package array of claim 6, wherein the plurality of stacked layers is formed of a photocured material.

9. The optically interactive electronic device package array of claim 8, wherein the photocured material is one of the group consisting of a photocured polymer and a photocured resin material.

10. The optically interactive electronic device package array of claim 1, further comprising:
a layer of adhesive material between the surface of the carrier substrate and the layer of barrier material.

11. The optically interactive electronic device package array of claim 10, wherein the layer of adhesive material is one of the group consisting of an epoxy adhesive, an acrylic adhesive, a two-component adhesive resin and a double-sided adhesive-coated tape.

12. The optically interactive electronic device package array of claim 10, wherein the layer of barrier material is a unitary frame formed of a mold compound.

13. The optically interactive electronic device package array of claim 12, further comprising:
a filler material incorporated within the mold compound.

14. The optically interactive electronic device package array of claim 13, wherein the filler material comprises silicon particles.

15. The optically interactive electronic device package array of claim 10, wherein the layer of barrier material is a unitary frame comprising a solid sheet of material having apertures formed therein.

16. The optically interactive electronic device package array of claim 1, further comprising:
a layer of adhesive material between a top surface of the layer of barrier material and the unitary transparent cover.

17. The optically interactive electronic device package array of claim 16, wherein the layer of adhesive material is one of the group consisting of an epoxy adhesive, a silicone adhesive, an acrylic adhesive, a two-component resin and a double-sided adhesive-coated tape.

18. The optically interactive electronic device package array of claim 1, wherein the unitary transparent cover is formed of one of the group consisting of glass, quartz and plastic.

19. The optically interactive electronic device package array of claim 1, wherein the unitary transparent cover is formed of borosilicate glass.

20. The optically interactive electronic device package array of claim 1, further comprising:
a transparent encapsulant material filling a space in the corresponding chip cavity of the array of chip cavities between the active surface of the optically interactive electronic device and the unitary transparent cover.

21. The optically interactive electronic device package array of claim 1, further comprising:
a raised lip around a perimeter of the top surface of the layer of barrier material and abutting an outside edge of the unitary transparent cover.

22. The optically interactive electronic device package array of claim 21, wherein the raised lip is integrally formed with the layer of barrier material.

23. The optically interactive electronic device package array of claim 1, wherein the optically interactive electronic device comprises a solid-state image sensor.

24. The optically interactive electronic device package array of claim 1, further comprising:
at least one discrete conductive element attached to the carrier substrate on a surface thereof opposite the surface bearing the device attachment areas and in communication with the at least one conductive trace.

25. The optically interactive electronic device package array of claim 1, wherein each optically interactive electronic device of the plurality of optically interactive electronic devices is dispersed in a chip cavity of the array of chip cavities.

* * * * *